(12) United States Patent
Nakamura et al.

(10) Patent No.: US 12,476,153 B2
(45) Date of Patent: Nov. 18, 2025

(54) SEMICONDUCTOR APPARATUS

(71) Applicant: Mitsubishi Electric Corporation, Tokyo (JP)

(72) Inventors: Hiroyuki Nakamura, Fukuoka (JP); Kazutoyo Takano, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 521 days.

(21) Appl. No.: 17/937,846

(22) Filed: Oct. 4, 2022

(65) Prior Publication Data
US 2023/0028753 A1    Jan. 26, 2023

Related U.S. Application Data

(62) Division of application No. 17/108,070, filed on Dec. 1, 2020, now Pat. No. 11,527,449.

(30) Foreign Application Priority Data

Jun. 4, 2020 (JP) ................ 2020-097745

(51) Int. Cl.
*H01L 21/66* (2006.01)
*H10D 12/00* (2025.01)
*H10D 62/10* (2025.01)

(52) U.S. Cl.
CPC ........... *H01L 22/32* (2013.01); *H10D 62/102* (2025.01); *H10D 62/106* (2025.01); *H10D 62/108* (2025.01); *H10D 62/112* (2025.01); *H10D 12/481* (2025.01)

(58) Field of Classification Search
CPC ......... H01L 22/30; H01L 22/32; H01L 22/34; H10D 62/102; H10D 62/106; H10D 62/108; H10D 62/112; H10D 12/481; H10D 64/117
See application file for complete search history.

(56) References Cited

U.S. PATENT DOCUMENTS

2002/0139991 A1    10/2002   Matsuo et al.
2007/0052014 A1*   3/2007    Takahashi ............ H10D 62/127
                                                       257/330

(Continued)

FOREIGN PATENT DOCUMENTS

JP        2002-359377 A       12/2002

*Primary Examiner* — Aaron J Gray
(74) *Attorney, Agent, or Firm* — Studebaker Brackett PLLC

(57) ABSTRACT

A semiconductor apparatus includes: a semiconductor substrate; a diffusion layer; a first depletion prevention region; a channel stopper electrode, a monitor electrode and an insulating film. The inner edge portion of the monitor electrode is positioned between the diffusion layer and the first depletion prevention region. A distance between the outer edge portion of the channel stopper electrode and the inner edge portion of the monitor electrode is a first distance. A distance between the diffusion layer and the first depletion prevention region is a second distance. The first and second distances are set so that a discharge voltage between the channel stopper electrode and the monitor electrode becomes greater than an avalanche breakdown voltage at a PN junction portion of the diffusion layer and the semiconductor substrate.

10 Claims, 3 Drawing Sheets

(56) References Cited

U.S. PATENT DOCUMENTS

| | | | |
|---|---|---|---|
| 2009/0090967 A1* | 4/2009 | Chen | H10D 30/0297 |
| | | | 438/270 |
| 2013/0248994 A1* | 9/2013 | Ninomiya | H10D 62/393 |
| | | | 257/334 |
| 2014/0145212 A1 | 5/2014 | Takeuchi et al. | |
| 2014/0332842 A1* | 11/2014 | Veeramma | H01L 23/62 |
| | | | 257/119 |
| 2015/0249149 A1 | 9/2015 | Lu | |
| 2019/0305140 A1 | 10/2019 | Morimoto | |

* cited by examiner

SEMICONDUCTOR APPARATUS

CROSS-REFERENCE TO RELATED APPLICATION

This application is a Divisional of U.S. patent application Ser. No. 17/108,070 filed Dec. 1, 2020, which claims priority to and the benefit of Japanese Patent Application No. 2020-097745 filed Jun. 4, 2020, the entire contents of which are incorporated herein by reference.

BACKGROUND OF THE INVENTION

Field

The present disclosure relates to a semiconductor apparatus.

Background

A power device which is a power semiconductor apparatus is widely used in various fields including fields of electric household appliances, electric cars and railroads, and fields of photovoltaic power generation and wind power generation which have attracted increased attention as power generation of renewable energy. In these fields, an inductive load such as an induction motor is often driven by an inverter circuit constituted with a power device. A configuration for driving the inductive load includes a freewheeling diode (hereinafter, referred to as an "FWD") for refluxing a current generated by counter electromotive force of the inductive load. Note that a normal inverter circuit includes a plurality of insulated gate bipolar transistors (hereinafter, referred to as "IGBTs") and a plurality of FWDs.

Performance of a semiconductor wafer is normally checked in a form of a wafer after manufacturing of the semiconductor wafer is completed. However, in a case where, for example, forward voltage drop of the IGBT and the FWD is measured, there is a case where a current which can flow is restricted due to a measurement technology. In such a case, the forward voltage drop is measured with a relatively low current, and forward voltage drop of a rated current is predicted, so that measurement accuracy degrades.

Further, forward voltage drop at the FWD is deeply involved with performance, and thus, it is extremely important to grasp the performance in a form of a wafer and give feedback to a manufacturing process. In a case where a plurality of devices are connected in parallel, it is important to grasp the performance in a form of a wafer because it is preferable to make forward voltage drop as uniform as possible. To achieve this, a semiconductor apparatus which achieves favorable measurement accuracy of forward voltage drop characteristics with a low current has been proposed (see, for example, JP 2002-359377 A).

SUMMARY

There is a case where IRRM leak between a first conductive cathode region and a second conductive anode region is measured. In this case, there is a problem that a potential difference occurs between a channel stopper electrode which is provided in a peripheral region so that the semiconductor wafer has withstand voltage characteristics and a monitor electrode which is provided in a termination region outside the peripheral region, due to some kind of abnormality and discharge occurs.

The present disclosure has been made to solve the problem as described above and is directed to providing a semiconductor apparatus which is capable of preventing discharge.

A semiconductor device according to the present disclosure includes: a semiconductor substrate of a first conductivity type including a device region in which a semiconductor device is provided; a diffusion layer of a second conductivity type provided on a surface of the semiconductor substrate at an outer periphery of the device region; a first depletion prevention region of the first conductivity type provided on the surface of the semiconductor substrate at the outer periphery of the device region, positioned on an inner side of the diffusion layer in the semiconductor substrate and separate from the diffusion layer; a channel stopper electrode electrically connected to the first depletion prevention region; a monitor electrode electrically connected to the diffusion layer and separate from the channel stopper electrode; and an insulating film covering an inner edge portion of the monitor electrode and an outer edge portion of the channel stopper electrode, wherein the inner edge portion of the monitor electrode is positioned between the diffusion layer and the first depletion prevention region, a distance between the outer edge portion of the channel stopper electrode and the inner edge portion of the monitor electrode is a first distance, a distance between the diffusion layer and the first depletion prevention region is a second distance, and the first and second distances are set so that a discharge voltage between the channel stopper electrode and the monitor electrode becomes greater than an avalanche breakdown voltage at a PN junction portion of the diffusion layer and the semiconductor substrate.

In the present disclosure, the first and second distances are set so that a discharge voltage between the channel stopper electrode and the monitor electrode becomes greater than an avalanche breakdown voltage at a PN junction portion of the diffusion layer and the semiconductor substrate. Thus, it is possible to prevent discharge.

Other and further objects, features and advantages of the invention will appear more fully from the following description.

DESCRIPTION OF EMBODIMENTS

A semiconductor apparatus according to the embodiments of the present disclosure will be described with reference to the drawings. The same components will be denoted by the same symbols, and the repeated description thereof may be omitted.

First Embodiment

Figure 1:
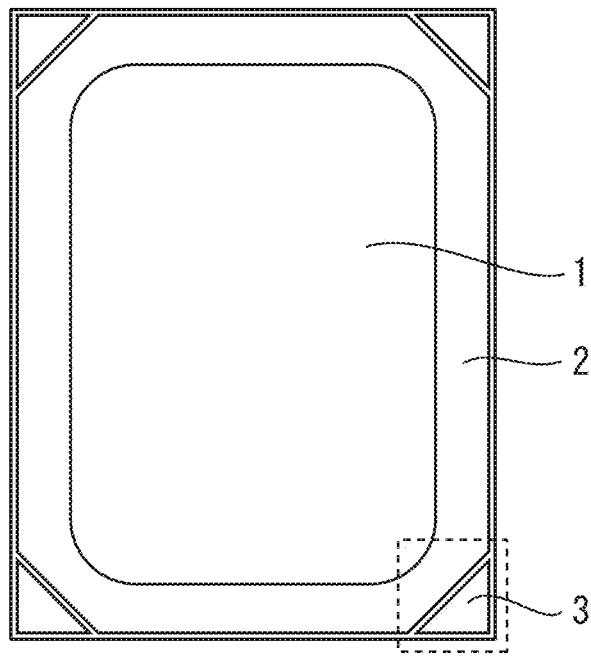
FIG. 1 is a top view illustrating a semiconductor apparatus according to a first embodiment.
Figure 2:
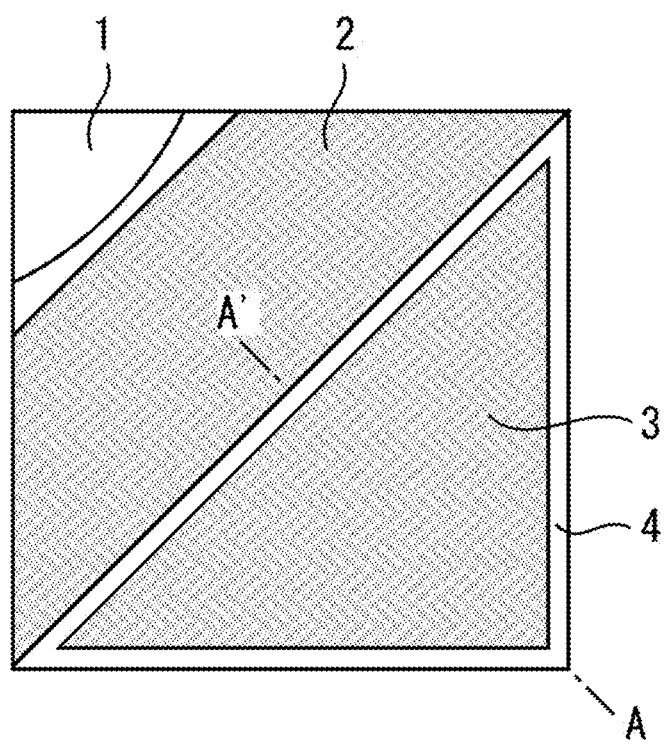
FIG. 2 is an expanded top view of the VF monitor region and a portion around the VF monitor region.

FIG. 1 is a top view illustrating a semiconductor apparatus according to a first embodiment. A diode is provided in a device region 1. A termination region 2 and VF monitor regions 3 are provided at an outer periphery of the device region 1. The VF monitor regions 3 are provided at four corners of a rectangular semiconductor apparatus. FIG. 2 is an expanded top view of the VF monitor region and a portion around the VF monitor region. Note that while FIG. 1 illustrates only one semiconductor apparatus, a plurality of semiconductor apparatuses are provided on a wafer and are separate from each other with dicing lines 4.

Figure 3:
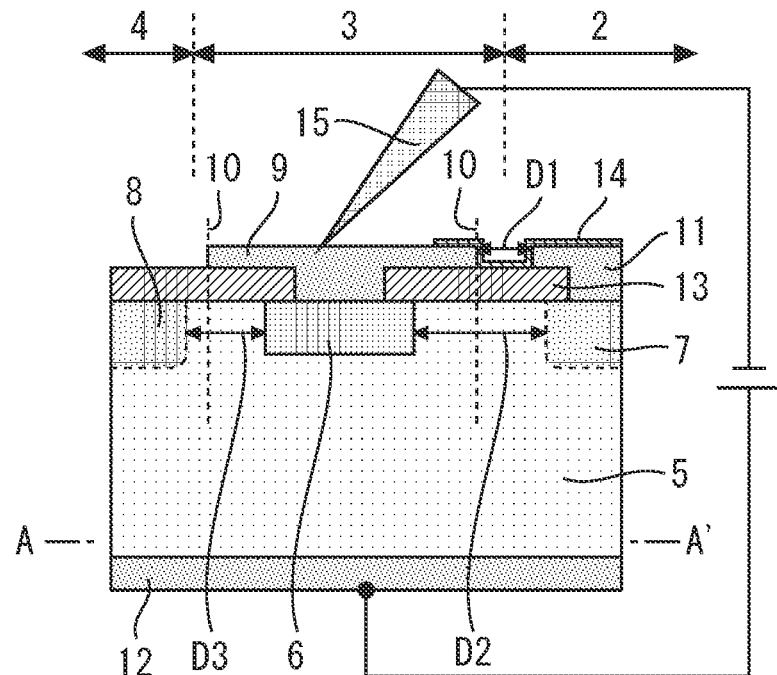
FIG. 3 is a cross-sectional view along a line A-A' in FIG. 2.
Figure 4:
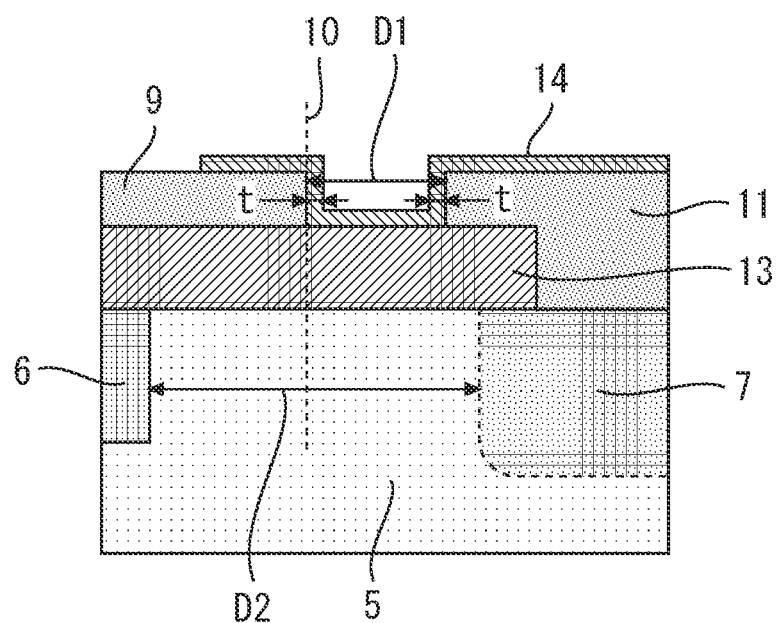
FIG. 4 is an expanded cross-sectional view of a portion in FIG. 3.

FIG. 3 is a cross-sectional view along a line A-A' in FIG. 2. FIG. 4 is an expanded cross-sectional view of a portion in FIG. 3. A second conductive type diffusion layer 6, a first conductive type first depletion prevention region 7, and a first conductive type second depletion prevention region 8 are provided on a surface of a first conductive type semiconductor substrate 5. For example, the first conductive type is an n type, and the second conductive type is a p type. The diffusion layer 6 is formed on the VF monitor regions 3 at the same time as an anode layer of the semiconductor device in the device region 1, and has the same impurity concentration and depth as those of the anode layer.

The first depletion prevention region 7 is positioned in the termination region 2 on an inner side of the diffusion layer 6 in the semiconductor substrate 5 and is separate from the diffusion layer 6 by a distance D2. The second depletion prevention region 8 is positioned in a dicing line 4 on an outer side of the diffusion layer 6 in the semiconductor substrate 5 and is separate from the diffusion layer 6 by a distance D3. Impurity concentration of the first depletion prevention region 7 and the second depletion prevention region 8 is higher than that of the semiconductor substrate 5.

An interlayer dielectric 13 such as silicon oxide is provided on a surface of the semiconductor substrate 5. An opening for exposing part of the first depletion prevention region 7 and the second depletion prevention region 8 is provided in the interlayer dielectric 13.

A monitor electrode 9 is provided on the interlayer dielectric 13 and is electrically connected to the diffusion layer 6 via the opening of the interlayer dielectric 13. A channel stopper electrode 11 is provided on the interlayer dielectric 13 and is electrically connected to the first depletion prevention region 7 via the opening of the interlayer dielectric 13. The channel stopper electrode 11 and the first depletion prevention region 7 are channel stoppers which prevent a depletion layer from expanding from the termination region 2 positioned on an inner side of the first depletion prevention region to outside. A back electrode 12 which is formed on a rear surface of the semiconductor substrate 5, is electrically connected to the semiconductor substrate 5.

The monitor electrode 9 and the channel stopper electrode 11 are closest to each other on the interlayer dielectric 13. A distance from an inner edge portion 10 of the monitor electrode 9 to an outer edge portion of the channel stopper electrode 11 is D1. For example, an insulating film 14 which includes SInSiN and which has a thickness t covers the inner edge portion 10 of the monitor electrode 9 and the outer edge portion of the channel stopper electrode 11.

A probe needle 15 is brought into contact with the monitor electrode 9 to apply a voltage between the monitor electrode 9 and the back electrode 12 and test a reverse withstand voltage in a form of a wafer or static characteristics of the diode. At this time, it is necessary to electrically separate the monitor electrode 9 from the channel stopper electrode 11 while maintaining a certain degree of withstand voltage. To achieve this, the inner edge portion 10 of the monitor electrode 9 is positioned between the diffusion layer 6 and the first depletion prevention region 7 in a lateral direction along the surface of the semiconductor substrate 5. In a similar manner, the outer edge portion of the monitor electrode 9 is positioned between the diffusion layer 6 and the second depletion prevention region 8.

The depletion layer expands from the diffusion layer 6 to the first depletion prevention region 7 and the second depletion prevention region 8 in accordance with a degree of the applied voltage. The first depletion prevention region 7 and the second depletion prevention region 8 have the same potential as that of the back electrode 12. When the depletion layer expanding from the diffusion layer 6 reaches the first depletion prevention region 7 or the second depletion prevention region 8, avalanche breakdown of a PN junction portion between the diffusion layer 6 and the semiconductor substrate 5 occurs at a voltage A. The avalanche breakdown causes electric charges to be discharged from the monitor electrode 9 or the back electrode 12.

Figure 5:
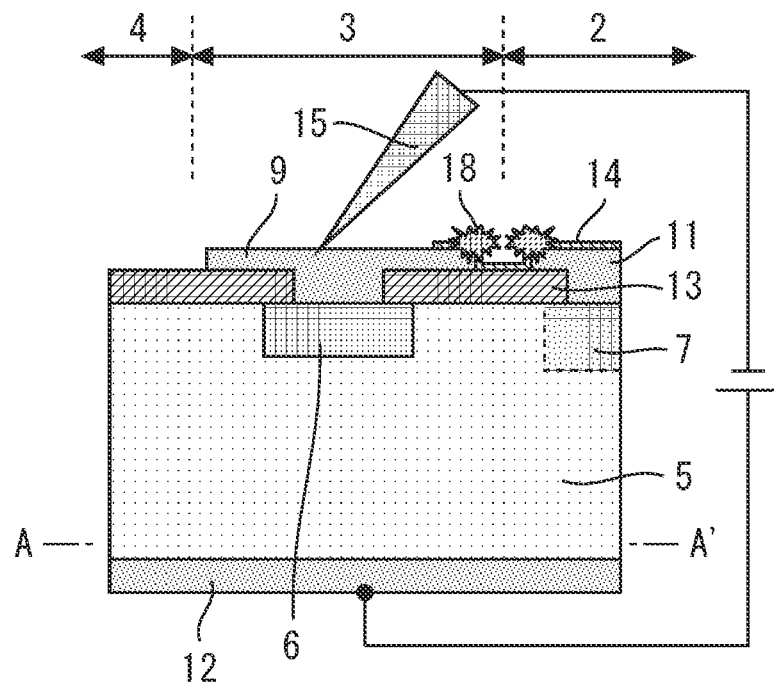
FIG. 5 is a cross-sectional view illustrating a semiconductor apparatus according to a comparative example.

FIG. 5 is a cross-sectional view illustrating a semiconductor apparatus according to a comparative example. The semiconductor apparatus according to the comparative example is not designed to cause avalanche breakdown. Consequently, discharge 18 may occur as a result of a voltage being applied between the monitor electrode 9 and the channel stopper electrode 11 covered with the insulating film 14.

If an avalanche breakdown voltage A at the PN junction portion of the diffusion layer 6 and the semiconductor substrate 5 held by the depletion layer is smaller than a discharge voltage B between the channel stopper electrode 11 and the monitor electrode 9, a voltage to be applied between the channel stopper electrode 11 and the monitor electrode 9 does not reach the discharge voltage B. Thus, in the present embodiment, distances D1, D2 and D3 are set so that the discharge voltage B becomes greater than the avalanche breakdown voltage A. In this manner, it is possible to prevent discharge by lowering withstand voltage characteristics of the monitor. This makes it possible to achieve favorable measurement accuracy of forward voltage drop characteristics mainly with a low current even in a chip having high current rating.

Relationship among the distances D1, D2 and D3 can be defined using combination of the following expression 1 and expression 2. Expression 1 is an expression of an avalanche breakdown voltage inside the semiconductor substrate 5. Expression 2 is an expression of a voltage at which discharge occurs between two electrodes.

$$V_{Sub} = EC_{Sub} \times W \qquad \text{(Expression 1)}$$

$$V = EC \times D \qquad \text{(Expression 2)}$$

Here, $V_{Sub}$ is an avalanche breakdown voltage inside the semiconductor substrate 5, $EC_{Sub}$ is dielectric breakdown electric field strength of the semiconductor substrate 5, and W is a width of the depletion layer. V in expression 2 is a discharge voltage, EC is dielectric breakdown electric field strength of an object such as air existing between two electrodes, and D is a distance between two electrodes.

Note that in a case of an IGBT or a Diode having a withstand voltage of 600 V which is used in a power device, 600 V<0.03 MV/cm×D1 in expression 2, so that the distance D1 of equal to or longer than 200 μm is required to prevent discharge. In a case of a withstand voltage of 1200 V, the distance D1 of equal to or longer than 400 μm which is twice the distance in a case of the withstand voltage of 600 V is required. It is therefore necessary to make distance D1 considerably long to prevent discharge without using avalanche breakdown, which inhibits downsizing of the apparatus.

Relational expressions in which the avalanche breakdown voltage falls below a discharge start voltage between two electrodes where the width W of the depletion layer in expression 1 is set as the distances D2 and D3 and the distance D between two electrodes in expression 2 is set at D1−2t, are the following expression 3 and expression 4.

$$D2<(EC_{Ins}/EC_{Sub})\times 2t+(EC_{bet}/EC_{sub})\times(D1-2t) \quad \text{(Expression 3)}$$

$$D3<(EC_{Ins}/EC_{Sub})\times 2t+(EC_{bet}/EC_{Sub})\times(D1-2t) \quad \text{(Expression 4)}$$

Here, $EC_{bet}$ is dielectric breakdown electric field strength of a substance other than the insulating film 14 existing between the inner edge portion of the monitor electrode 9 and the outer edge portion of the channel stopper electrode 11, $EC_{Ins}$ is dielectric breakdown electric field strength of the insulating film 14, and t is a thickness of the insulating film 14.

In a case where these relational expressions are satisfied, avalanche breakdown occurs inside the semiconductor substrate 5 with a value lower than a voltage at which discharge occurs between the monitor electrode 9 and the channel stopper electrode 11, so that it is possible to prevent discharge between the two electrodes.

For example, it is assumed that the semiconductor substrate 5 is made of Si, dielectric breakdown electric field strength of Si is 0.3 MV/cm, the insulating film 14 is a nitride film having dielectric breakdown electric field strength of 8 MV/cm, a distance between the monitor electrode 9 and the channel stopper electrode 11 is 20 μm, a portion between the two electrodes is filled with air having dielectric breakdown electric field strength of 0.03 MV/cm, and a thickness t of the insulating film 14 is 500 nm. In this case, it can be understood from expression 3 that discharge is prevented if the distance D2 is equal to or less than approximately 28 μm. Note that the distance D2 which can prevent discharge can be obtained in a similar manner even if the semiconductor substrate 5 is a wide band gap semiconductor such as SiC. Further, considering that the dielectric breakdown electric field strength of air is lower than that of the insulating film 14 by approximately double digits, second terms of expression 3 and expression 4 may be ignored in a case where the portion between the two electrodes is filled with air. It is obvious that the discharge start voltage and the distances D2 and D3 change in accordance with a material of the insulating film 14, a position at which the insulating film 14 is positioned, whether or not the insulating film 14 is positioned.

Note that it is only necessary to achieve the avalanche breakdown voltage A lower than the discharge voltage B in one of the first depletion prevention region 7 and the second depletion prevention region 8. The second depletion prevention region 8 may be therefore omitted.

Further, in the present embodiment, impurity concentration of the diffusion layer 6 is preferably lower than impurity concentration of the semiconductor substrate 5. In this case, the depletion layer also expands to inside of the diffusion layer 6. Therefore, this causes avalanche breakdown to occur at a voltage lower than the avalanche breakdown voltage A defined with the distances D2 and D3 of the depletion prevention regions, so that it is possible to further prevent discharge. Note that similar effects can be obtained even if the diode provided in the device region 1 is replaced with other semiconductor devices such as an IGBT or a MOSFET.

Second Embodiment

Figure 6:
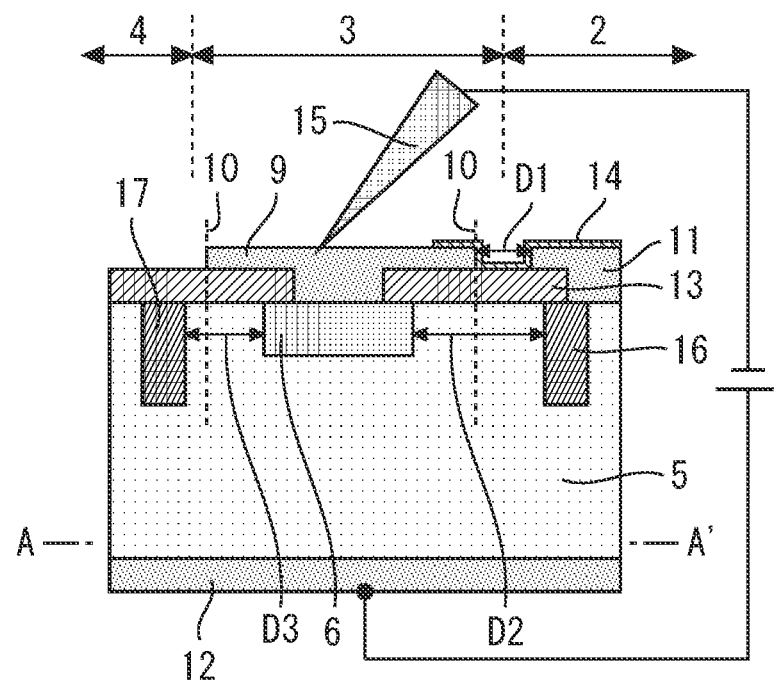
FIG. 6 is a cross-sectional view illustrating a semiconductor apparatus according to a second embodiment.

FIG. 6 is a cross-sectional view illustrating a semiconductor apparatus according to a second embodiment. In the present embodiment, a first trench 16 and a second trench 17 are provided in place of the first depletion prevention region 7 and the second depletion prevention region 8 in the first embodiment.

The first trench 16 is positioned on an inner side of the diffusion layer 6 in the semiconductor substrate 5 and is separate from the diffusion layer 6 by the distance D2. The second trench 17 is positioned on an outer side of the diffusion layer 6 in the semiconductor substrate 5 and is separate from the diffusion layer 6 by the distance D3. The first trench 16 and the second trench 17 have a structure which is similar to the structure of a trench gate of the IGBT formed in the device region, and in which, for example, polysilicon is embedded into a trench via a gate insulator film. Note that the first trench 16 and the second trench 17 are dummy trench gates because this polysilicon is not connected to the gate. The channel stopper electrode 11 is electrically connected to the polysilicon of the first trench 16.

Expansion of the depletion layer expanding from the diffusion layer 6 physically stops at the first trench 16 and the second trench 17, and the depletion layer does not expand any further. As indicated in expression 1, limiting the width W of the depletion layer can lower the avalanche breakdown voltage $V_{Sub}$. Thus, in a similar manner to the first embodiment, the distances D1, D2 and D3 are set so that the discharge voltage B between the channel stopper electrode 11 and the monitor electrode 9 becomes greater than the avalanche breakdown voltage A at the PN junction portion of the diffusion layer 6 and the semiconductor substrate 5. This can prevent discharge.

Further, since the first depletion prevention region 7 and the second depletion prevention region 8 are formed through injection of impurities, it is necessary to design positions of the first depletion prevention region 7 and the second depletion prevention in view of diffusion of impurities. In contrast, it is easy to design the first trench 16 and the second trench 17 because positions of the first trench 16 and the second trench 17 are uniquely determined in accordance with a pattern.

The semiconductor substrate 5 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-097745, filed on Jun. 4, 2020 including specification, claims, drawings and summary, on which the convention priority of the present application is based, is incorporated herein by reference in its entirety.

The invention claimed is:

1. A semiconductor apparatus comprising:
a semiconductor substrate of a first conductivity type including a device region in which a semiconductor device is provided;
a diffusion layer of a second conductivity type provided on a surface of the semiconductor substrate at an outer periphery of the device region;
a first trench provided on the surface of the semiconductor substrate at the outer periphery of the device region, positioned on an inner side of the diffusion layer in the semiconductor substrate and separate from and adjacent to the diffusion layer;
a channel stopper electrode electrically connected to the first trench;
a monitor electrode electrically connected to the diffusion layer and separate from the channel stopper electrode; and
an insulating film covering an inner edge portion of the monitor electrode and an outer edge portion of the channel stopper electrode,
wherein the inner edge portion of the monitor electrode is positioned between the diffusion layer and the first trench,
a distance between the outer edge portion of the channel stopper electrode and the inner edge portion of the monitor electrode is a first distance,
a distance between the diffusion layer and the first trench is a second distance, and
the first and second distances are set so that a discharge voltage between the channel stopper electrode and the monitor electrode becomes greater than an avalanche breakdown voltage at a PN junction portion of the diffusion layer and the semiconductor substrate.

2. The semiconductor apparatus according to claim 1, further comprising a second trench provided on the surface of the semiconductor substrate at the outer periphery of the device region, positioned on an outer side of the diffusion layer in the semiconductor substrate and separate from the diffusion layer,
an outer edge portion of the monitor electrode is positioned between the diffusion layer and the second trench,
a distance between the diffusion layer and the second trench is a third distance, and
the third distance is set so that the discharge voltage becomes greater than the avalanche breakdown voltage.

3. The semiconductor apparatus according to claim 1, wherein the first distance is D1, the second distance is D2, dielectric breakdown electric field strength of the insulating film is $EC_{Ins}$, dielectric breakdown electric field strength of the semiconductor substrate is $EC_{Sub}$, a thickness of the insulating film is t, dielectric breakdown electric field strength of a substance other than the insulating film existing between the outer edge portion of the channel stopper electrode and the inner edge portion of the monitor electrode is $EC_{bet}$, and $$D2 < (EC_{Ins}/EC_{Sub}) \times 2t + (EC_{bet}/EC_{Sub}) \times (D1-2t).$$

4. The semiconductor apparatus according to claim 2, wherein the first distance is D1, the third distance is D3, dielectric breakdown electric field strength of the insulating film is $EC_{Ins}$, dielectric breakdown electric field strength of the semiconductor substrate is $EC_{Sub}$, a thickness of the insulating film is t, dielectric breakdown electric field strength of a substance other than the insulating film existing between the outer edge portion of the channel stopper electrode and the inner edge portion of the monitor electrode is $EC_{bet}$, and $$D3 < (EC_{Ins}/EC_{Sub}) \times 2t + (EC_{bet}/EC_{Sub}) \times (D1-2t).$$

5. The semiconductor apparatus according to claim 1, wherein an impurity concentration of the diffusion layer is lower than an impurity concentration of the semiconductor substrate.

6. The semiconductor apparatus according to claim 1, wherein the semiconductor substrate is made of a wide-band-gap semiconductor.

7. The semiconductor apparatus according to claim 1, wherein the first trench comprises polysilicon embedded into the first trench via a gate insulator film.

8. The semiconductor apparatus according to claim 1, wherein the first trench is a dummy trench.

9. The semiconductor apparatus according to claim 2, wherein the second trench comprises polysilicon embedded into the second trench via a gate insulator film.

10. The semiconductor apparatus according to claim 2, wherein the second trench is a dummy trench.

* * * * *